(12) United States Patent
Grossniklaus et al.

(10) Patent No.: US 8,847,595 B2
(45) Date of Patent: Sep. 30, 2014

(54) TEMPERATURE CONTROL DEVICE FOR AN NMR SAMPLE TUBE

(75) Inventors: Beat Grossniklaus, Neerach (CH); Federico Raffa, Zurich (CH); Markus Mayer, Gossau (CH); Dirk Wilhelm, Maur (CH)

(73) Assignee: Bruker BioSpin AG, Faellanden (CH)

( * ) Notice: Subject to any disclaimer, the term of this patent is extended or adjusted under 35 U.S.C. 154(b) by 471 days.

(21) Appl. No.: 13/104,071

(22) Filed: May 10, 2011

(65) Prior Publication Data

US 2011/0284192 A1    Nov. 24, 2011

(30) Foreign Application Priority Data

May 18, 2010  (DE) .......................... 10 2010 029 080

(51) Int. Cl.
 *G01V 3/00* (2006.01)
(52) U.S. Cl.
 USPC .......................................... 324/318; 324/315
(58) Field of Classification Search
 USPC ..................... 324/300–322; 600/407–445
 See application file for complete search history.

(56) References Cited

U.S. PATENT DOCUMENTS

| 5,192,910 A | 3/1993 | Hepp |
| 6,768,305 B1 | 7/2004 | Keifer |

(Continued)

FOREIGN PATENT DOCUMENTS

| JP | 52 117985 | 9/1977 |
| JP | 58 099655 | 7/1983 |

(Continued)

OTHER PUBLICATIONS

Loening N. M. et al., "Temperature accuracy and temperature gradients in solution-state NMR spectrometers" Journal of Magnetic Resonance, Academic Press, Orlando, FL, US, vol. 159, No. 1, Nov. 1, 2002, pp. 55-61.

*Primary Examiner* — Brij Shrivastav
(74) *Attorney, Agent, or Firm* — Paul Vincent (57) ABSTRACT

Temperature control device (20) for an NMR sample tube (22), wherein multiple interleaved, concentric flow channels (28, 31; 40, 41, 42; 50, 51) for temperature control fluid extending coaxially with respect to a cylindrical interior space (21) for holding the NMR sample tube are constituted around said interior space (21), wherein said temperature control device is constituted such that it is closed toward the interior space in an axial end region (26) and, an axial end region (23) at the opposite end thereto, open to the interior space for inserting the NMR sample tube into said interior space (21), wherein, in a counter flow region (GB), adjacent flow channels (28, 31; 40, 41, 42; 51) are interconnected through a fluid passage (34, 43, 44) at one axial end in such a way that the direction of a fluid flow in the flow channels of the counter flow region is reversed with respect to the corresponding adjacent flow channel in the counter flow region, wherein the outermost flow channel (28; 51) of the counter flow region has a fluid inlet (32) at one axial end, and wherein the innermost flow channel (31; 42) of the counter flow region has a fluid passage (36) to the interior space at one axial end that faces toward the axial end region that is closed, is characterized in that at least one of the flow channels, in particular, the outermost flow channel (28; 50) of the temperature control device and/or the next outermost flow channel (31; 40; 50) of the temperature control device has a fluid outlet (35) at one axial end, through which at least part (MS) of the temperature-controlling fluid flow that is conveyed along the outermost flow channel (28; 50) of the temperature control device can escape from the temperature control device without passing through all of the flow channels of the counterlow region. With this invention, temperature control of an NMR sample tube can be ensured with low temperature gradients, while achieving a high temperature control performance.

24 Claims, 9 Drawing Sheets

(56) References Cited

U.S. PATENT DOCUMENTS

| | | | |
|---|---|---|---|
| 6,914,430 B2 * | 7/2005 | Hasegawa et al. | 324/315 |
| 7,262,600 B2 * | 8/2007 | Kawasaki et al. | 324/321 |
| 7,304,477 B2 * | 12/2007 | Konijn et al. | 324/318 |
| 7,819,826 B2 * | 10/2010 | Diederich et al. | 601/3 |
| 2007/0007963 A1 | 1/2007 | Kawasaki | |

FOREIGN PATENT DOCUMENTS

| | | |
|---|---|---|
| JP | 04-262279 | 9/1992 |
| JP | 2007017391 | 1/2007 |

* cited by examiner

TEMPERATURE CONTROL DEVICE FOR AN NMR SAMPLE TUBE

This application claims Paris Convention priority of DE 10 2010 029 080.7 filed May 18, 2010 the complete disclosure of which is hereby incorporated by reference.

BACKGROUND OF THE INVENTION

The invention relates to a temperature control device for an NMR sample tube, wherein multiple interleaved, concentric flow channels for temperature control fluid extending coaxially with respect to a cylindrical interior space for holding the NMR sample tube are constituted around said interior space, wherein said temperature control device is constituted such that it is closed toward the interior space in an axial end region and, in an axial end region at the opposite end thereto, open to the interior space for inserting the NMR sample tube into said interior space,
wherein, in a counter flow region, adjacent flow channels are interconnected through fluid passage at one axial end in such a way that the direction of a fluid flow in the flow channels of the counter flow region is reversed with respect to the corresponding adjacent flow channel in the counter flow region,
wherein the outermost flow channel of the counter flow region has a fluid inlet at one axial end,
and wherein the innermost flow channel of the counter flow region has a fluid passage to the interior space at one axial end that faces toward the axial end region that is closed.

Such a temperature control device is known from DE 40 18 734 C2.

Nuclear magnetic resonance (NMR) spectroscopy is a powerful method of instrumental analysis. In NMR spectroscopy, radio-frequency (RF) pulses are irradiated into a measurement sample that is disposed in a strong, static magnetic field, and the RF response of the measurement sample is then measured. The information is obtained by integration across a certain region of the measurement sample, termed the active volume.

The temperature of the measurement sample always influences the result of an NMR spectroscopy measurement. To obtain high-quality measurement results, the measurement sample is kept at a temperature that is as constant and as uniform as possible across the entire active volume. To this end, a temperature control device is typically located in the sample head of an NMR spectrometer. Heating and cooling measurement samples for NMR measurement are both common practice.

In a common measurement method, the measurement sample (that is, the substance from which analytical information is to be derived) is disposed in an NMR sample tube. Typical NMR sample tubes have an outside diameter of 5 mm and a length of approx. 18 cm, wherein the active volume extends along approx. 25 mm of the length. In the NMR spectrometer, the NMR sample tube is held at one (usually the upper) end and the other, free (usually lower) end is surrounded by RF coils and protrudes into the temperature control device; frequently, the RF coils are integrated in the temperature control device.

In common temperature control devices, a temperature-controlled fluid (usually a gas such as air or nitrogen, in some cases, also a liquid) flows around the sample tube at least in the region of the active volume. In the simplest case, the temperature control device constitutes a chamber into which a free end of the sample tube is inserted through an opening; a fluid flow is then introduced into the chamber and directed toward the free end. The fluid exits in the region of the opening (which is not completely blocked at the edge of the sample tube). However, such simple temperature control devices exhibit relatively high temperature gradients in the fluid flow and/or along the length of the active volume of the NMR sample tube because the temperature of the fluid flow comes closer to the ambient temperature as it passes through the chamber. (For example, it cools down in the case of a heating temperature-controlling fluid flow.) Heat flows, in particular, through the outer wall of the temperature control device through which the fluid is flowing and also along the NMR sample tube itself toward the tube holder (mounting).

To reduce the temperature gradient in the fluid flow surrounding the NMR sample tube, it is known that temperature control devices can be constituted according to the counter flow principle, cf. DE 40 18 734 C2, FIG. 2 therein. In DE 40 18 734 C2, a fluid flow is initially conveyed along an outer, ring-shaped flow channel in a first axial direction parallel to the sample tube, then redirected and conveyed back in the opposite axial direction along an inner flow channel and then redirected again and conveyed directly along the sample tube and out through the opening into which the NMR sample tube protrudes into the interior space of the temperature control device. The walls between the flow channels and toward the interior space act as heat exchangers, so that the temperature gradient in the fluid flow immediately adjacent to the sample tube is noticeably reduced.

One disadvantage of this prior art, however, is the relatively low temperature control performance that can be achieved by the fluid flow. The multiple redirection and the routing of the fluid flow immediately adjacently to the sample tube causes a large flow resistance, which limits the fluid flow. There is also a danger of the NMR sample tube being pressed out of the temperature control device and damaged under high fluid pressure.

The object of the invention is to ensure temperature control of an NMR sample tube with low temperature gradients while achieving a high temperature control performance.

SUMMARY OF THE INVENTION

This object is achieved by a temperature control device of the type stated in the introduction, characterized in that at least one of the flow channels, in particular, the outermost flow channel of the temperature control device and/or the next outermost flow channel of the temperature control device has a fluid outlet at one axial end, through which at least part of the temperature-controlling fluid flow that is conveyed along the outermost flow channel of the temperature control device can escape from the temperature control device without passing through all of the flow channels of the counter flow region.

The inventive temperature control device works on the counter flow principle, wherein an additional outer flow is provided. The additional outer flow either flows in a dedicated flow channel (additional flow channel; this then surrounds the flow channels of the counter flow region), or it flows in the outermost flow channel of the counter flow region (together with the counter flow, separation being performed at a later stage). The counter flow region is composed of mutually serially connected flow channels, between which the axial flow direction alternates from each flow channel to the next.

The fluid flow or portion of the fluid flow that escapes through the inventive fluid outlet from the outermost flow channel of the temperature control device (outer flow) flows neither through the flow channels of the counter flow region, that is, through the remaining flow channels of the counter flow region located further inside, nor past the outer surface of the NMR sample tube.

A very large fluid flow can then be provided in the outermost flow channel, even if the fluid flow in the flow channels located further inside and/or immediately adjacent to the NMR sample tube are subject to high flow resistance, for instance, due to redirection or a small flow cross-section.

The total temperature control performance (cooling or heating) can be increased by the outer flow component. At the same time, the temperature gradient of the fluid flow along the NMR sample tube can be kept low by the counter flow component. If a very high temperature control performance is required, it can be provided by a high outer flow. The counter flow can be kept low so that no unfavorably high pressure occurs in the region of the sample tube, which may even press the sample tube out of the temperature control device. If a common inlet is provided for the outer flow and the counter flow, a total temperature-controlling fluid flow that is accidentally too high can be relieved via the inventive fluid outlet (or the outer flow component).

Typically, the axial walls that separate the flow channels from one another and the wall that limits the interior space are good thermal conductors in the transverse direction (i.e. they act as heat exchangers), to keep temperature gradients low. The flow channels extend in the axial direction and have a (typically constant) ring-shaped cross-section. The temperature-controlling fluids that are preferably used are gas, for example, air or nitrogen. Typically, at least 35%, preferably at least 50% of the total temperature-controlling fluid flow entering the temperature controlling device escapes through the inventive fluid outlet at the axial end of the outermost or next outermost flow channel of the temperature control device. The total temperature-controlling fluid flow entering the temperature control device is usually between 500 l/h and 1200 l/h.

In an especially preferred embodiment of the inventive temperature control device, the outermost flow channel of the counter flow region and/or the next outermost flow channel of the counter flow region has the fluid outlet at the axial end that faces away from the fluid inlet, in particular, wherein all flow channels of the temperature control device are part of the counter flow region. In this embodiment, the outermost flow channel of the counter flow region can additionally be used for the outer flow. A dedicated (additional) flow channel for the outer flow is not required. The inventive fluid outlet at the end of the outermost flow channel of the counter flow region or at the beginning of the next outermost flow channel of the counter flow region ensures that a fluid flow from the outermost flow channel of the counter flow region is divided between the fluid outlet and the next outermost flow channel. The entire temperature-controlling fluid flow (comprising the outer flow component and the counter flow component) can then be fed in at the fluid inlet. Preferably, the fluid outlet and the fluid passage between the outermost and the next outermost flow channel of the counter flow region are constituted such that at least 35%, preferably at least 50% of the total fluid flow exits through the fluid outlet.

In an advantageous further variant of this embodiment, the outermost flow channel of the counter flow region comprises an outer compartment and an inner compartment, which are separated by an axial intermediate wall, wherein the axial intermediate wall extends along a section of the axial length of the outermost flow channel of the counter flow region, wherein this part of the axial length extends away from one axial end of the outermost flow channel of the counter flow region that has the fluid outlet, and wherein the outer compartment has the fluid outlet, and the inner compartment has the fluid passage to the next outermost flow channel. By means of the intermediate wall, the division of the outer flow component and the counter flow component can be located away from the fluid outlet and, in particular, the division of the two components and the redirection of the counter flow component can be separated. In this way, better (less turbulent) flow behavior of the fluid can be achieved. The compartments each have a ring-shaped cross-section, are interleaved, concentric and extend in the axial direction. In this embodiment, the fluid inlet supplies both compartments so that the fluid flows in the same direction in both compartments; for this, the fluid inlet flows into the undivided (usually lower) section of the outermost flow channel of the counter flow region. As an alternative to this embodiment, it is also possible for the outermost flow channel of the counter flow region to be undivided. The remaining flow channels are generally undivided (irrespective of whether the outermost flow channel of the counter flow channel is divided).

An alternative, equally preferred embodiment comprises an additional flow channel that surrounds the outermost flow channel of the counter flow region, wherein the additional flow channel has an additional fluid inlet at one axial end and the fluid outlet at an opposite axial end. In the additional flow channel, the outer flow can be conveyed independently of the counter flow. Because of the fluid inlet (for the counter flow region) and the additional flow inlet (at the additional flow channel), no separation of a total fluid flow in the region of the fluid outlet (and of a fluid passage to the next outermost flow channel) is required, which avoids turbulent flow. It is also basically possible to regulate, in particular, to control the temperatures and set the flowrates of the outer flow and the counter flow independently.

A further variant of this embodiment is preferred in which the fluid inlet and the additional fluid inlet are constituted at the same axial end region of the temperature control device and are connected to a joint supply of a temperature-controlling fluid flow. The joint supply simplifies temperature control and saves space in the NMR sample head. However, in this further embodiment, the ratio of outer flow to counter flow results from the geometry of the fluid conduits. Alternatively, separate supplies can also be provided for the fluid inlet and the additional fluid inlet.

In an advantageous embodiment of the inventive temperature control device, an axial wall that separates the outermost flow channel of the counter flow region or the additional flow channel from the next outermost flow channel exhibits a thermal transmittance $U_{AN}$ in the transverse direction, and any other remaining axial walls that are between the flow channels of the counter flow region and an axial wall that separates the innermost flow channel from the interior space, each exhibit a thermal transmittance in the transverse direction greater than $U_{AN}$, preferably greater than $3*U_{AN}$, highly preferably greater than $10*U_{AN}$, and further preferably greater than $50*U_{AN}$. In other words, the axial wall that separates the outer flow channel of the counter flow region or the additional flow channel from the next outermost flow channel has heat-insulating properties (and does not act as a heat exchanger). In this way, a reduction in the temperature gradient of the fluid flow at the NMR sample tube or even an inversion of this temperature gradient can be achieved, especially if the fluid inlet and possibly the additional fluid inlet, on the one hand, and the fluid outlet and the holder of the NMR sample tube, on the other hand, are constituted at opposite axial end regions. The thermal transmittance can be determined from the thermal conductivity divided by the wall thickness. The wall between the outermost and the next outermost flow channel can be manufactured from a material with poorer thermal conductivity properties than the remaining walls, or have a considerably greater wall thickness.

In a preferred embodiment, the fluid outlet is constituted at one axial end of the outermost flow channel of the temperature control device and/or of the next outermost flow channel of the temperature control device that faces the open axial end region. The fluid inlet (and possibly also the additional fluid inlet) is equally preferably constituted at the axial end of the associated flow channel that faces the closed axial end region. In this case, the fluid supply and the holder of the NMR sample tube do not obstruct each other; the space available in a typical NMR sample head can be well utilized.

In an especially preferred embodiment, the interior space is constituted as a regular cylinder and the flow channels are ring-shaped in cross-section. With a ring-shaped cross-section of the NMR sample tube, very even flow of the temperature-controlling fluid around the NMR sample tube can be achieved; this reduces transverse temperature gradients. Alternatively, other, in particular, polygonal (for instance, quadrilateral or hexagonal) cross-sections of the interior space and the flow channels are possible; however rotational symmetry around the axis of the NMR sample tube or the centrally located center axis of the interior space are preferred.

In an advantageous embodiment, the fluid inlet and/or the additional fluid inlet and/or the fluid outlet and/or at least one of the fluid passages is/are constituted by multiple openings distributed symmetrically around a center axis of the interior space. This makes even flow of the fluid around the NMR sample tube possible; temperature gradients are reduced. If a fluid inlet is constituted with multiple openings they are typically fed through a joint supply.

Equally advantageous is an embodiment in which the fluid inlet and/or the additional fluid inlet and/or the fluid outlet and/or at least one of the fluid passages is constituted by a ring-shaped gap. In this way, too, even flow around the NMR sample tube can be achieved. If a ring-shaped gap is to be used at a fluid inlet, a preceding chamber with overpressure can be implemented into which the fluid inlet leads and from which fluid evenly flows through the ring-shaped gap.

In a preferred embodiment the counter flow region comprises exactly two interleaved flow channels. This configuration is relatively simple and has proven successful in practice. Alternatively, three or more flow channels are possible.

In a further advantageous embodiment, the number of interleaved flow channels of the counter flow region is even. The fluid inlet and the fluid outlet are usually constituted in opposite axial end regions and the fluid inlet faces away from the open axial end region. The fluid inlet can then be constituted completely at one axial end region (usually below) and the fluid outlet can be constituted completely at the opposite axial end region (usually at the top). In this way, a compact configuration can be achieved.

Equally preferable is an embodiment in which at least one flow channel contains an RF coil, in particular, wherein the RF coil is seated against the inner wall of a flow channel. By integrating the RF coil or RF coils into the temperature control device, both the temperature control device and the RF coils can be positioned near to the NMR sample tube. The RF coil is preferably seated against the outer surface of an axial wall of the temperature control device (and is thus positioned on the inside of the two axial walls of a flow channel). Preferably, one radio-frequency (=RF) coil is positioned in both the innermost flow channel and in the second innermost flow channel (please note that the gap between the NMR sample tube and the wall of the interior space does not, in this case, count as a flow channel).

Furthermore, this invention also comprises a method for controlling the temperature of an NMR sample tube, wherein a temperature-controlling fluid flow is conveyed according to the counter flow principle in interleaved flow channels alternately along a direction of axial extension of the NMR sample tube and in the reverse direction, characterized in that, in addition to the fluid flow according to the counter flow principle, a temperature-controlling fluid flow according to the outer flow principle is used, wherein the fluid flow according to the outer flow principle comprises at least part of the region in which the fluid flow is conveyed according to the counter flow principle and at least part of the NMR sample tube. The fluid flow according to the counter flow principle ("counter flow") flows at least partially further inside as the fluid flow according to the outer flow principle ("outer flow"). The counter flow then preferably flows directly around the NMR sample tube, whereas the outer flow flows around the counter flow region or parts of the counter flow region, thus providing "pre-temperature control" of the counter flow region, that is, brings it closer to the desired target temperature for the NMR sample tube (as compared with the ambient temperature). By means of the outer flow, a very high temperature control performance at the NMR sample tube can be achieved, wherein at the same time, a very slight temperature gradient can be achieved by means of the counter flow at the NMR sample tube. The (usually relatively high) flow resistance of the counter flow is not relevant for the outer flow and therefore does not limit the temperature control performance.

In a preferred variant of the inventive method, the fluid flow according to the outer flow principle is conveyed only once along the direction of extension of the NMR sample tube. The outer flow then does not have to be redirected and only encounters a slight flow resistance. In this way, high outer flows and thus high temperature control performance can be achieved.

In a preferred variant of the inventive method, a temperature-controlling total fluid flow has a first part for temperature control according to the outer flow principle and a second part for temperature control according to the counter flow principle, wherein the first part and the second part initially flow together, in particular, in an outermost flow channel of a temperature control device, and are separated thereafter. As a result, only one supply (or one source/one temperature control system) is required for a temperature-controlling fluid flow and the number of required flow channels can be kept low. This method variant is therefore particularly easy to implement.

In an advantageous further development of this method variant, the separated second part is thermally insulated from the axial temperature gradient in the separated first part or in the jointly flowing total fluid flow or in the separated second part (counter flow) in a section that is located upstream. In this way, an axial temperature gradient can be produced in the second part that runs in the reverse direction to the axial temperature gradient in the first part or in the total flow or in the upstream section of the second part. By this means, it is possible to obtain particularly low axial temperature gradients in the NMR sample tube.

In another equally preferred variant of the inventive method, the fluid flow according to the counter flow principle and the fluid flow according to the outer flow principle are conveyed completely separately and, in particular, are separately regulated and temperature-controlled. In this way, the ratio of outer flow to counter flow can be set flexibly, especially, to adapt the measuring conditions individually to specific sample systems or experimental procedures. The separate routing of outer flow and counter flow can also help to reduce turbulent flow (and thus poor temperature control performance).

A further development of this method variant is preferred in which the fluid flow according to the counter flow principle is thermally insulated from a temperature gradient in the fluid flow according to the outer flow principle or in the fluid flow according to the counter flow principle in an upstream section. This permits an inversion of the temperature gradient in the counter flow relative to the outer flow and/or to the upstream section of the counter flow, which can be used for particularly even temperature control of the NMR sample tube.

The scope of this invention also includes the use of an inventive temperature control device as described above, in particular, in an inventive method as described above, for the temperature control of an NMR sample tube, which is disposed in the interior space of the temperature control device. By using the inventive temperature control device, a high temperature control performance (and thus the establishment of large temperature differences compared with the environment and also fast setting of the target temperature on the NMR sample tube) can be achieved with low (axial) temperature gradients in the NMR sample tube. Typically, the outer flow is at least 35%, preferably 50% of the overall fluid flow (sum of outer flow and counter flow).

An especially preferred variant of the inventive use deploys gas, in particular, air or nitrogen, as the fluid. Air and nitrogen are reasonably priced and do not noticeably interfere with NMR measurements. The gas is preferably dehumidified.

A use variant is advantageous in which a temperature gradient is established in the fluid flow on the outer surface of the NMR sample tube, which is inverted with respect to the temperature gradient in the fluid flow in the outermost flow channel of the temperature control device. If the fluid inlet (and possibly also the additional fluid inlet) faces away from (is located opposite) the open axial end region (and therefore from the tube holder), the inverted temperature gradient can counteract the thermal transmittance path through the tube holder, and a temperature gradient that is particularly low or tending to zero can be achieved in the NMR sample tube or in the measurement sample contained therein.

Further advantages of the invention can be derived from the description and the drawing. The characteristics according to the invention stated above and further characteristics explained below can also be used either individually or in any combination. The embodiments shown and described are not intended to be an exhaustive list but are examples used to explain the invention.

The invention is depicted in the drawing and is explained in more detail by means of example embodiments. The figures show.

BRIEF DESCRIPTION OF THE DRAWING

DESCRIPTION OF THE PREFERRED EMBODIMENT

The invention relates to the temperature control of NMR sample tubes with an extended performance range.

NMR sample tubes are usually operated (measured) at a defined temperature, which is set by means of the NMR spectrometer and should be kept stable. It is necessary to keep the temperature constant in this way because the spectra generated in the NMR depend on the temperature of the sample substance (measurement sample), which finally causes changes to the ambient temperature to be reflected in the measurement result (displacement of individual frequency lines). Depending on the experiment, these effects may interfere with and falsify the image.

Most sample tubes used in NMR are manufactured from borosilicate (glass), are regular cylinders and have an outside diameter of 5 mm and a total length of approximately 7" (approx. 18 cm). The active volume from which the NMR measurement information is obtained is located in the lower third of the tube and usually extends along approximately 25 mm of the sample tube (measurement window). The active volume is surrounded by NMR coils (RF coils), which homogenously excite the atoms in this region via an excitation field (B1 field) that is orthogonal to the main field (B0 field). In the active volume, the excited atoms produce a weak magnetic alternating field, which is received again by corresponding NMR coils. To obtain equal contributions to the magnetic alternating field as far as possible from all parts of the active volume, a temperature that is as equal as possible is required across the entire active volume, that is, the temperature gradient should tend to zero.

Herein, it must be ensured that heat dissipation is performed along the sample tube toward the region where the sample tube is no longer temperature-controlled, that is, where the holder for the NMR sample tube is located.

Today's requirements of temperature control of NMR measurement samples can achieve a regulation stability of the temperature of +/−0.01 K at a stable ambient temperature of +/−1 C. Furthermore, an evenness of temperature across the active volume of the sample tube is also required, which is described by a temperature gradient. A typical requirement for a temperature gradient is in the order of 0.1° K/cm or better, if the temperature gradient is understood to be linear along the longitudinal axis of the sample tube, or absolute of the order of 0.3 K or better (highest temperature minus lowest temperature within the active volume, which extends, for example, over 25 mm of the axial length).

Temperature control devices of the prior art exhibit a low temperature control performance or a high temperature gradient and/or are difficult to design. With this invention, an improved temperature control performance is made possible in a simple way, wherein a temperature controlling fluid flow with a slight positive or even a negative temperature gradient (i.e. inverse temperature control with respect to the heat input/loss through a sample tube holder) can be achieved ("redirection separation with limited conductivity").

Figure 1A:
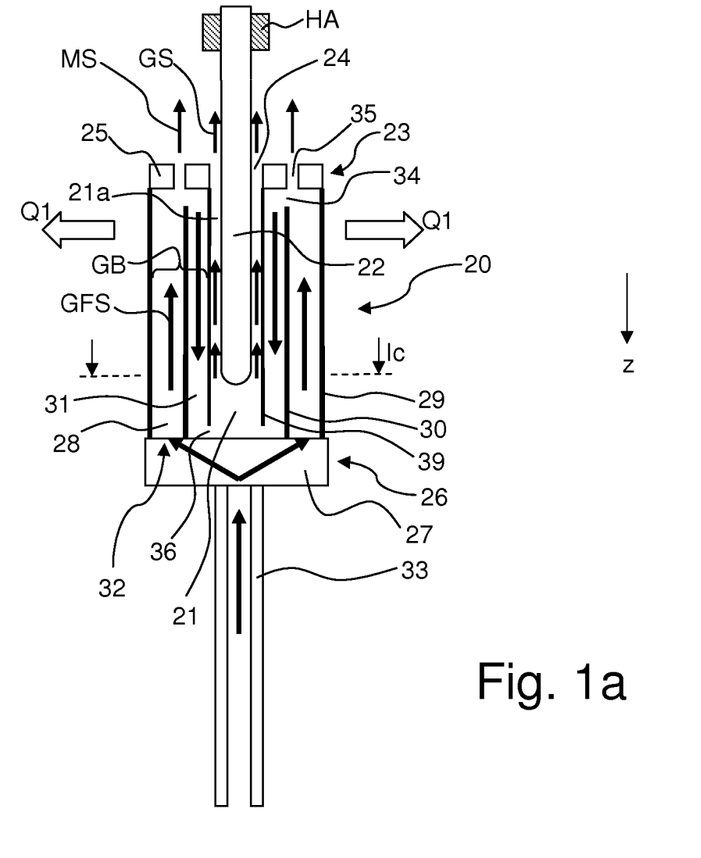
FIG. 1a A schematic axial cross-sectional view of an inventive temperature control device, represented without RF coils.
Figure 1B:
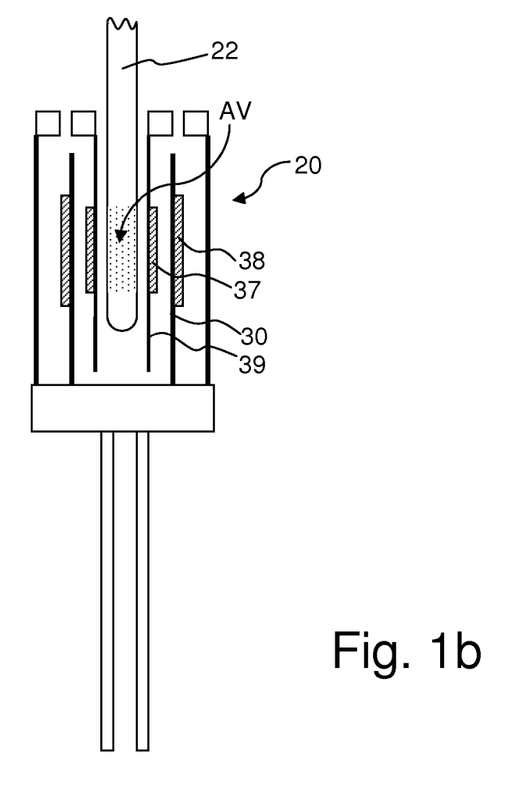
FIG. 1b A schematic axial cross-sectional view of the inventive temperature control device of FIG. 1a, represented with RF coils but without fluid flow.
Figure 1C:
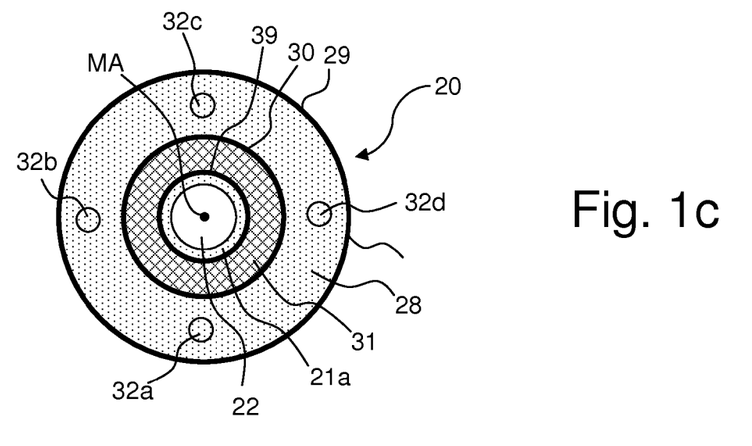
FIG. 1c A schematic radial cross-sectional view of the inventive temperature control device of FIG. 1a at the level of plane 1c.

FIGS. 1a, 1b and 1c schematically show an embodiment of an inventive temperature control device 20 in an axial sectional view (FIG. 1a, simplified in FIG. 1b) and in a horizontal (radial) sectional view (FIG. 1c, cf. line of intersection 1c in FIG. 1a). The temperature control device 20 permits the temperature control of an NMR sample tube 22 with a fluid flow (cf. arrows in FIG. 1a). Typically, a gas is used as the fluid, for example, air or nitrogen; the temperature of the (inflowing) fluid is regulated in a defined manner (not shown in any greater detail), typically to a temperature between −150° C. and +150° C.

The temperature control device 20 has a cylindrical (a regular cylinder in this case) interior space 21 in which an NMR sample tube 22 can be disposed. The temperature control device 20 is also open to the interior space 21 in the upper axial end region 23, cf. opening 24 in the upper closing element 25. In the lower axial end region 26, the temperature control device 20 is closed toward the interior space 21, cf. the lower closing element 27. The NMR sample tube 22 protrudes into the interior space 21 with its free, lower end, and a holder HA, for example, a spinner, (only indicated in FIG. 1a) is disposed at the upper end of the sample tube 22.

The temperature control device 20 comprises multiple flow channels for the fluid flow around the interior space 21. An outermost flow channel 28 is bounded by the axial walls 29 and 30, and an innermost flow channel 31 is bounded by the axial walls 30 and 39. At the same time, the axial wall 39 bounds the interior space 21. The walls 29, 30, 39 are typically made of glass.

The flow channels 28, 31 are each ring-shaped (here) and are interleaved. They are disposed concentrically to the (here) regular cylindrical interior space 21 (cf. FIG. 1c) and extend parallel to the axial direction (z-direction).

The outermost flow channel 28 has a fluid inlet 32 at its lower end, which here is constituted with four openings 32a-32d, each of which is fed from a joint supply 33. The openings 32a-32d are disposed symmetrically (evenly) around a center axis MA of the interior space 21. By this means, an approximately uniform upward fluid flow (cf. arrows) can be achieved along the entire flow channel 28.

A fluid passage 34 to the next outermost, here the innermost flow channel 31, is constituted at the upper end of the outermost flow channel 28. In the simplest version, this fluid passage 34 is constituted as ring-shaped gap. A fluid passage 35 is also constituted at the upper end of the outermost flow channel 28; this fluid passage 35 can also be constituted as a ring-shaped gap or with symmetrically distributed openings, here in the upper closing element 25.

A first part (outer flow component MS) of the total fluid flow GFS of the outermost flow channel 28 passes through the fluid outlet 35 and out of the temperature control device 20, and a second part (counter flow component GS) passes into the second flow channel 31. This second part GS flows downward through the second flow channel 31, that is, opposite to the flow direction in the adjacent outermost flow channel 28.

A further fluid passage 36, preferably a ring-shaped gap, is constituted at the lower end of the second flow channel 31. This flow passage 36 leads into the interior space 21. The second part GS of the total fluid flow can then (after redirection in the closed axial end region 26) flow upward along the outer surface of the NMR sample tube 22 in the axial gap 21a between wall 39 and sample tube 22 and flow out through the part of opening 24 not obstructed by the sample tube 22. The fluid flow along the outer surface of the NMR sample tube 22 itself flows in the opposite direction to the fluid flow in the innermost flow channel 31.

The outer flow component MS of the total fluid flow GFS in the outermost flow channel 28 thus radially surrounds the counter flow component GS in flow channel 31 and in interior space 21 as well as the lower part of the NMR sample tube 22, and can thus support temperature control of the NMR sample tube 22 by the counter flow component GS. The outer flow component MS flows through the outermost flow channel 28 together with the counter flow component GS in the counter flow region GB; the outer flow component MS does not flow through the next outermost flow channel 31 (note that the gas outlet 35 could also be constituted at the top at the flow channel 31; but, in this case, the outer flow component MS would not flow through the lower part of the flow channel 31).

FIG. 1c shows the flow direction of the fluid in the various regions of the temperature control device 20; the dotted areas indicate a flow toward the observer (upward in FIG. 1a) and a cross-hatched pattern indicates a flow away from the observer (downward in FIG. 1a). The flow direction moves further inward from flow channel to flow channel, and again toward the interior space 21.

The flow channels 28 and 31 constitute a counter flow region GB in which the flow direction of the temperature controlling fluid is axially reversed with respect the adjacent flow channel in each case. In the embodiment of FIGS. 1a-1c, all flow channels 28, 31 are part of the counter flow region GB, and flow channel 28 is simultaneously the outermost flow channel of the temperature control device 20 as well as the outermost flow channel of the counter flow region GB.

A radio frequency (=RF) coil 37, 38 is disposed on both the outside of the innermost axial wall 39 and on the outside of the second innermost axial wall 30 of the temperature control device 20, for example, pushed on axially. Atoms can be excited in an active volume AV (dotted in FIG. 1b) in NMR sample tube 22 or in the measurement sample contained therein (B1 field) with the RF coils 37, 38, and spin echoes received from the active volume AV. The essentially regular cylindrical NMR sample tube 22 typically has an outside diameter of 5 mm and an axial length of approx. 7" (approx. 18 cm) and is manufactured from borosilicate glass. The active volume is located in the lower third of the NMR sample tube 22 and typically has an axial extension of approx. 25 mm.

The temperature conditions and heat flows in an inventive temperature control device are described in more detail below using various model suggestions, cf. FIG. 2a-2c. A heating gas flow for the NMR sample tube is described by way of example; the embodiments apply accordingly to a cooling gas flow.

Figure 2A:
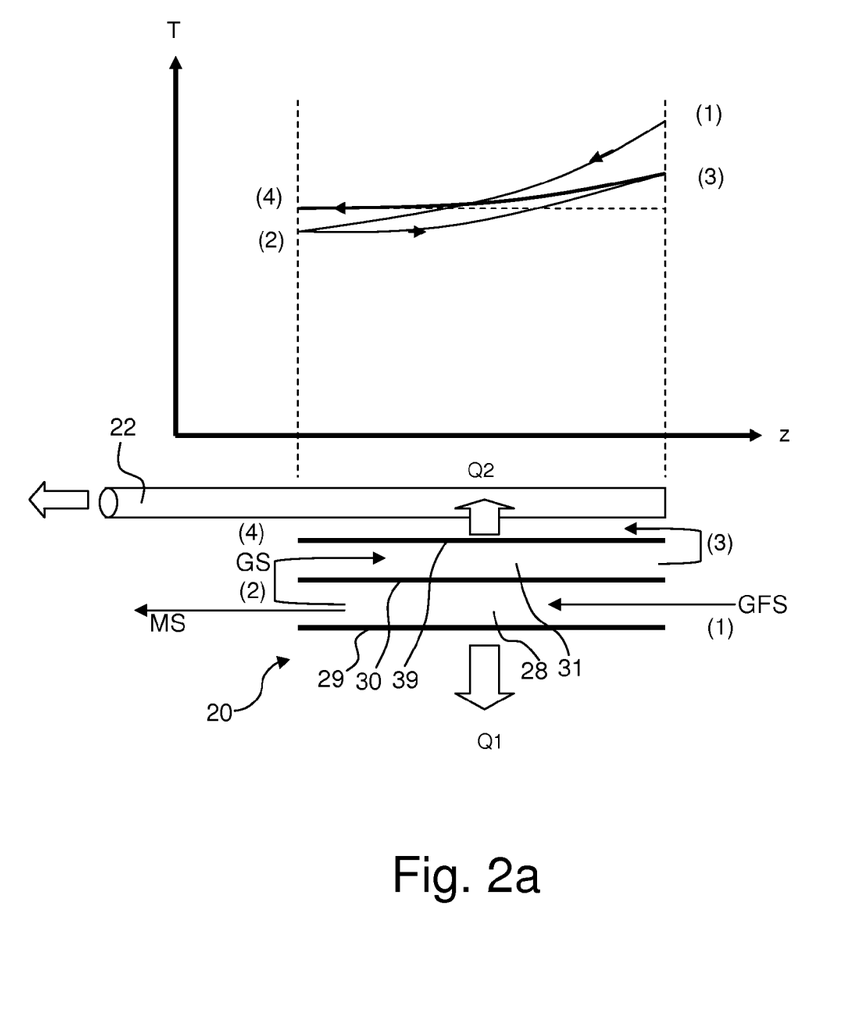
FIG. 2a A temperature diagram and a schematic cross-sectional view of the gas flow of an inventive temperature control device (according to FIG. 1a-1c) with a small heat loss Q2.

The lower half of FIG. 2a schematically shows the structure of a cylindrical gas flow in an inventive temperature control device (as presented in FIG. 1a-1c) in cross-section, wherein for reasons of symmetry only one half is represented together with the NMR sample tube 22. Wall (cylinder) 29 is the outer closing element of the gas flow in the temperature control device and produces a certain heat loss Q1 to the outside. The heat loss Q1 is here assumed to be of the same magnitude along the entire axial length of the wall 29, resulting from the identical heat transfer throughout. In this model, wall 29 shall have no heat resistance in the transverse direction (perpendicular to z), in the longitudinal direction (z-direction, axial direction), a certain resistance or even complete non-conduction of heat can be assumed.

The temperature-control gas flow enters at (1) (cf. gas inlet 32 in FIG. 1*a*) and cools down continuously due to the peripheral heat lost Q1 in the outermost flow channel 28, thus exhibiting a positive temperature gradient. That means that the gas flow is warmer at the entry point (1) than at the exit point (2) (fluid outlet 35 in FIG. 1*a*) and/or the temperature increases along the positive z direction. The additional outlet at position (2) (fluid outlet 35 in FIG. 1*a*) permits an outer flow MS, which has a significantly higher volume flow than the volume flow that is led past the sample tube 22 due to the gas redirection (counter flow component GS).

The outer flow MS serves to compensate for the losses Q1 toward the outside and the fast generation of a temperature envelop so that the entire system is taken to extreme temperatures within as short a time as possible. Practical temperatures for the NMR sample tubes 22 range from −150° C. to +150° C., which are generated by means of nitrogen cooling or electrical heating. The positive pressure produced at (2) by the outer flow MS in conjunction with sufficiently narrow outlets (fluid outlet 35) in an otherwise closed system results in the remaining volume flow (counter flow GS), which passes through the gas redirection and brushes past sample tube 22 upward (in FIG. 2*a* to the left). This makes temperature control of this system very efficient, which has been proven in experiments and simulations.

The temperature-control gas flow GS that is redirected at (2) then flows through the next outermost flow channel 31, bounded by the walls (cylinder) 30 and 39 and is redirected once again at (3) and exits the temperature controlling system (temperature control device 20) in the upward direction (to the left in FIG. 2*a*) past the sample tube 22.

According to the assumptions of the model in FIG. 2*a*, each redirection is identical and the cylinder walls 39, 30, 29 have similar heating properties. The flow channels 28, 31 and walls 30, 39 actually together constitute a heat exchanger, which independently balances the temperature profile. This is represented in the graph at the top of FIG. 2*a*, which plots the temperature in the fluid flow. The entry temperature at (1) is lowered toward (2). After redirection, the gas flow heats up from (2) to (3) through the thermally conducting cylinder wall 30 and has a higher temperature again at (3). At the subsequent redirection from (3) to (4), this heat is reduced again a little, both at the sample tube 22 (heat loss Q2) and at the wall (cylinder wall) 39.

As the progression of the curves in FIG. 2*a* shows, what is happening here is that the temperature gradients are evened out due to the heat exchange across the cylinder walls 30 and 39. The more stages this exchanger has, the more uniform this temperature profile will be at the end; for example, to achieve an even more uniform temperature profile, two more flow channels could be connected inside to flow channel 31 (with alternating gas flow) before the gas flow is directed into the interior space to the sample tube 22 (cf. FIG. 4).

This makes it possible for the system depicted in FIG. 2*a* to set just a slight, positive temperature gradient, or in a borderline case, a temperature gradient tending toward zero in the fluid flow at NMR sample tube 22 from (3) to (4) (i.e. in gap 21*a*, cf. FIG. 1*a*). With this system, temperature control of a sample tube 22 can be advantageously performed with a comparatively flat temperature profile.

Figure 2B:
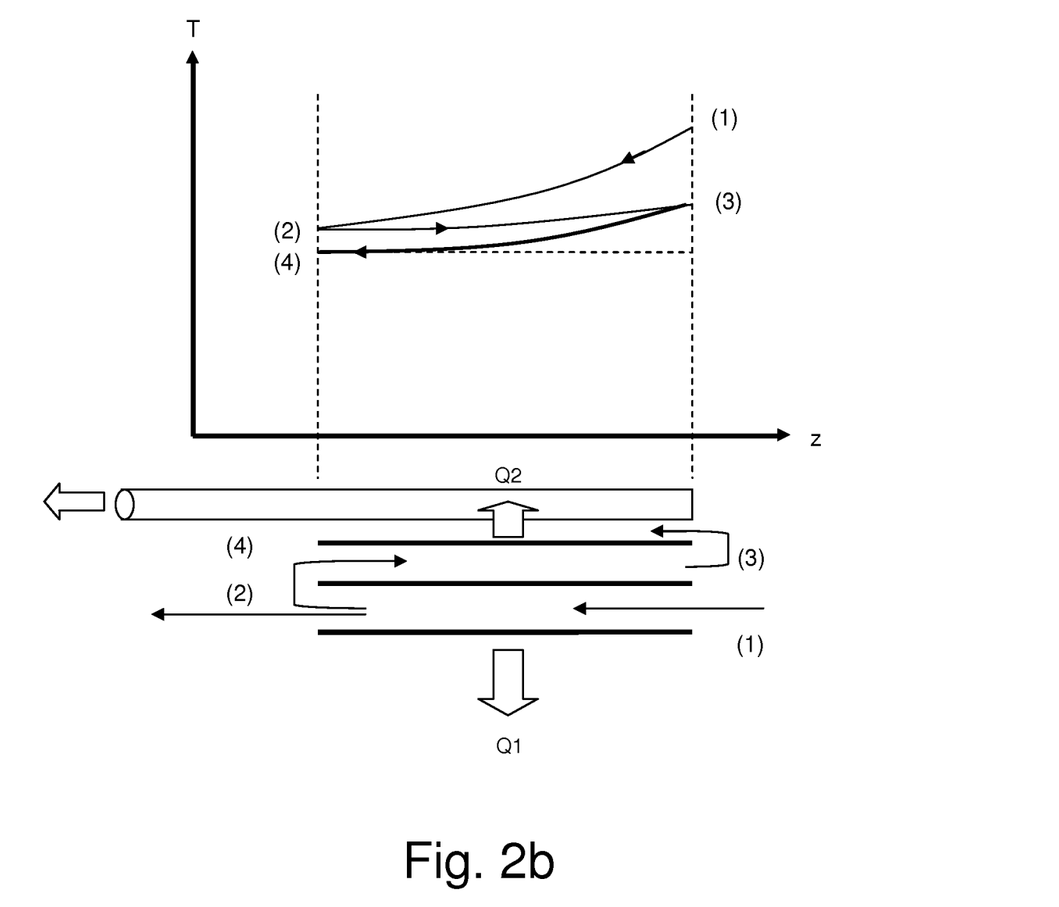
FIG. 2b A temperature diagram and a schematic cross-sectional view of the gas flow of an inventive temperature control device as shown in FIG. 2a but with a large heat loss Q2.

FIG. 2*b* depicts a model according to the model of FIG. 2*a*, but assuming a greater heat loss Q2 as compared with the model of FIG. 2*a*. In this case, the temperature drops further in all flow sections and, in particular, the temperature at (4) remains under the temperature at (2).

Figure 2C:
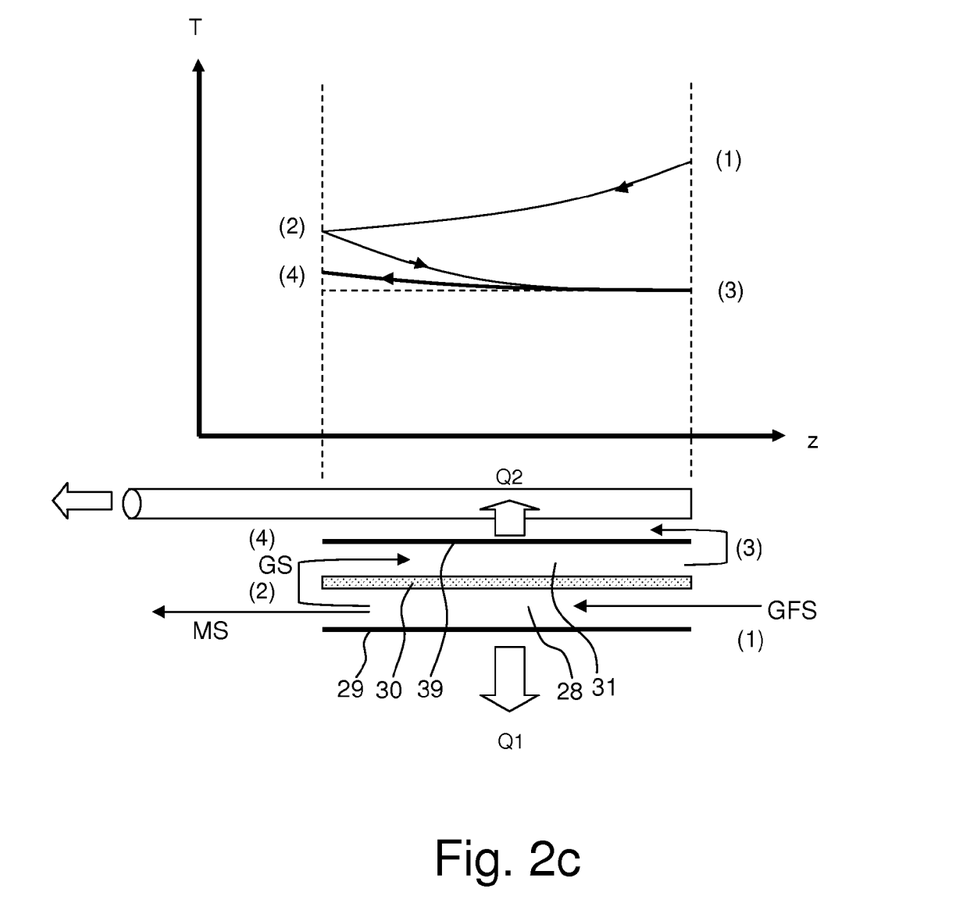
FIG. 2c A temperature diagram and a schematic cross-sectional view of the gas flow of an inventive temperature control device as shown in FIG. 2a but with inversion of the temperature gradient by means of a heat insulating cylinder wall.

In FIG. 2*c*, the model of FIG. 2*a* is varied such that it is assumed that the cylinder wall 30 insulates moderately to heavily in the transverse direction, i.e. little to no heat exchange takes place between the outer flow channel 28 and the next outermost flow channel 31, i.e. from (2) to (3). Walls 29 and 39 can further be assumed to have thermal resistance tending to zero in the transverse direction.

The resulting temperature curves in the gas flow are shown in the upper part of FIG. 2*c*. The entry temperature at (1) decreases toward (2), due solely to the losses Q1 to the outside. After redirection at (2), the gas flow cools down further because it transfers energy toward the inside in the direction of cylinder wall 39. The temperature therefore falls from (2) to (3). After the last redirection at (3) the gas flow can however heat up again slightly in the negative z-direction through cylinder wall 39. Now, for the first time a negative temperature gradient is produced in the gas flow along the outer surface of the sample tube 22, which upwardly counteracts the inherent loss of the sample tube. In other words, the temperature-control gas along the NMR sample tube increases toward the supported end of the sample tube and can thus compensate for the cooling of the sample tube at the holder. As a result, a negligible temperature gradient can be produced in the sample tube.

In simplified terms, it can be said that the insulated cylinder wall 30 in principle reverses the inlet flow direction into the heat exchanger, which is why the sign in front of the resulting and remaining temperature gradient in the gas flow is inverted.

Figure 3:
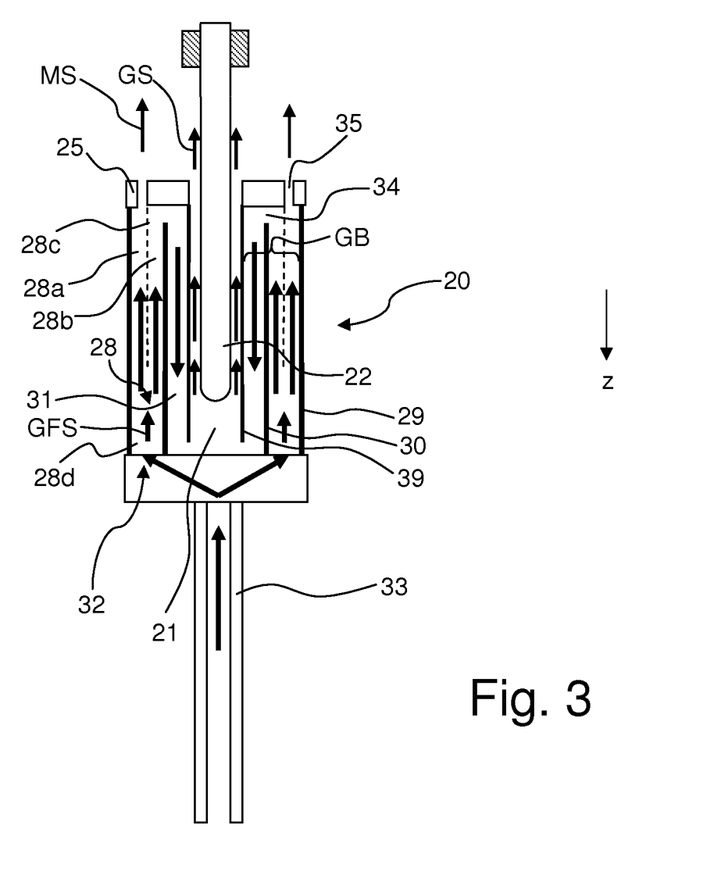
FIG. 3 A schematic axial cross-sectional view of an inventive temperature control device with an outermost flow channel comprising two compartments in the upper region.

FIG. 3 shows an alternative embodiment of an inventive temperature control device 20. The description below mainly explains the differences as compared with the embodiment depicted in FIG. 1*a*.

In the depicted embodiment, the outermost flow channel 28 in its upper part (facing the gas outlet 35) has two compartments 28*a*, 28*b*, which are separated from each other by an axial (cylindrical) intermediate wall 28*c*; the intermediate wall 28*c* here extends from the upper closing element 25 along approx. ⅔ of the axial length of the outermost flow channel 28. The axial intermediate wall 28*c* is typically made of glass.

The fluid inlet 32 here flows into a lower, joint section 28*d* of the flow channel 28, from which both compartments 28*a*, 28*b* depart again, so that both compartments 28*a*, 28*b* also each receive a part of the total fluid flow GFS that exits the supply 33. The fluid flows in both compartments 28*a*, 28*b* flow in the same direction (in this case, upward).

The outermost compartment 28*a* leads to the fluid outlet 35, through which the outer flow component MS escapes. The inner compartment 28*b*, which conveys the counter flow component GS flows to the fluid passage 34 and thus into the next outermost flow channel 31.

In this embodiment, the total fluid flow GFS is separated (divided) at the transition from the joint section 28*d* to the compartments 28*a*, 28*b*, that is, at the lower end of the intermediate wall 28*c*. As a result, turbulences in the region of the fluid outlet 35 and of the fluid passage 34 are reduced.

Alternatively (cf. FIG. 1*a*), it is also possible to constitute all flow channels 28, 31, and in particular, the outermost flow channel 28 without divisions (without an axial intermediate wall).

Figure 4:
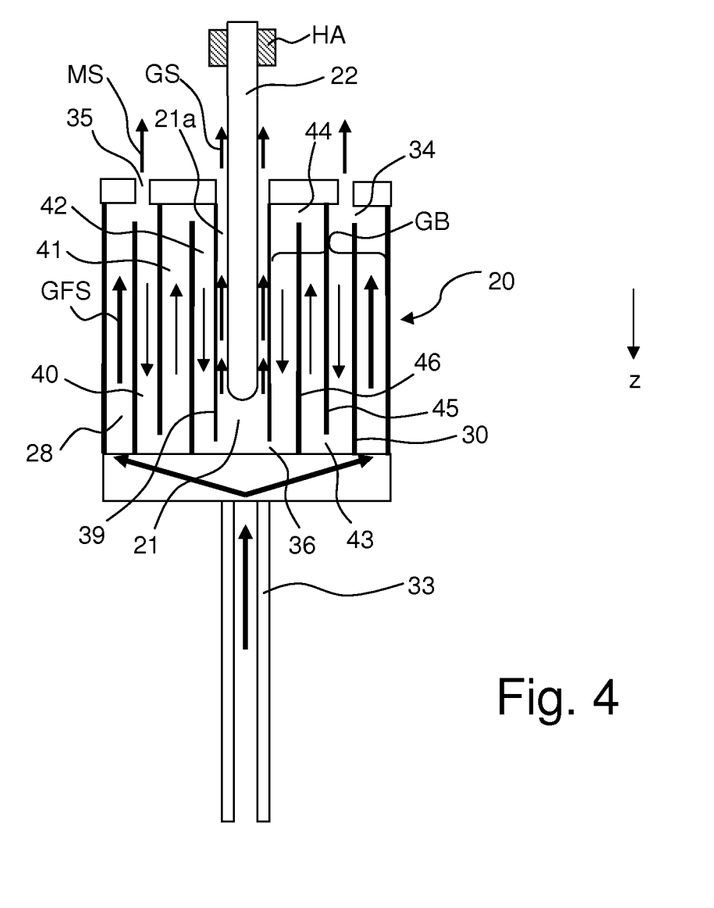
FIG. 4 A schematic axial cross-sectional view of an inventive temperature control device with four interleaved flow channels.

FIG. 4 shows a further embodiment of an inventive temperature control device 20 that comprises a total of four flow channels 28, 40, 41, 42. Here again, mainly the differences as compared with the embodiment in FIG. 1a are explained.

The outermost flow channel 28 has gas inlet 32 for the total fluid flow GFS at its lower end. Fluid outlet 35 is exhibited at the upper end of the second outermost flow channel 40; the outer flow component MS flows out here; the outer flow component MS therefore only flows through a very small, upper portion of the flow channel 40, but not through its lower portion. The counter flow component GS continues on through the flow channels 40, 41, 42 and in the interior space 21 past sample tube 22.

The flow channels 28, 40, 41, 42 are connected via the fluid passages 34, 43, 44 (ring-shaped gaps) in the walls 30, 45, 46 and at their ends in such a way that the (axial) flow direction of the fluid reverses into the adjacent flow channel in each case ("alternating flow direction"), cf. the arrows in FIG. 4. All flow channels 28, 40, 41, 42 are part of the counter flow region GB.

A very uniform axial temperature profile (along the z direction) in the fluid flow in gap 21a along sample tube 22 can be achieved due to the large number of flow channels (here four, without gap 21a), through which the counter flow component GS is guided.

Figure 5:
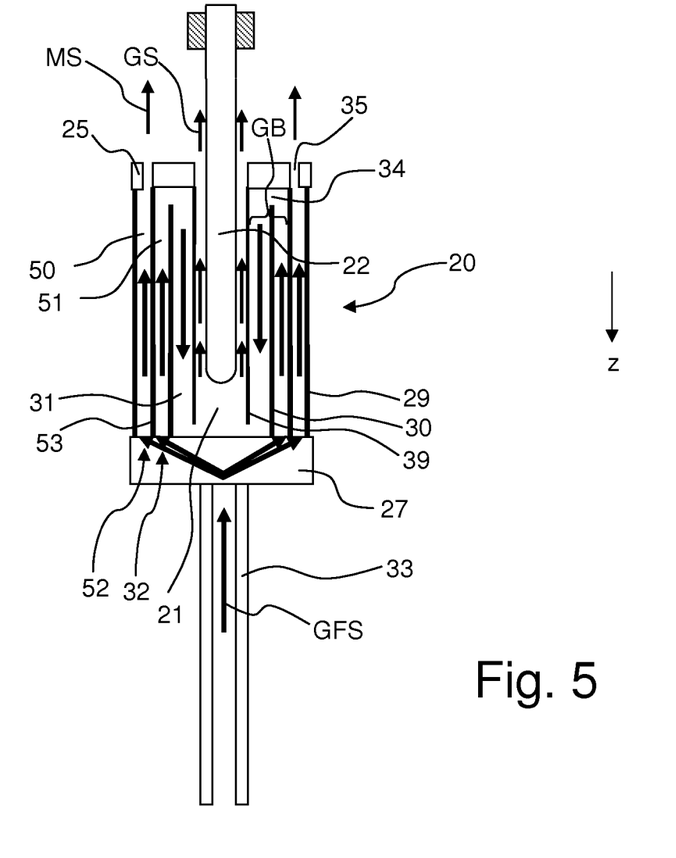
FIG. 5 A schematic axial cross-sectional view of an inventive temperature control device with a joint supply for an additional flow channel and a counter flow region.

FIG. 5 shows a further embodiment or an inventive temperature control device 20. Here again, mainly the differences as compared with the embodiment in FIG. 1a are explained.

In this embodiment, the total fluid flow GFS in the joint supply 33 in the lower closing element 27 is divided between the fluid inlet 32 and an additional fluid inlet 52.

The fluid inlet 32 flows into an outermost flow channel 51 of the counter flow region GB. The counter flow component GS flows through the flow channels 51, 31 of the counter flow region GB and in the interior space 21 along the outer surface of the NMR sample tube 22, wherein the flow direction alternates.

The additional fluid inlet 52 flows into an additional flow channel 50 in which the outer flow component MS is conveyed. The additional flow channel 50 and the outer flow component MS here radially surround all flow channels 51, 31 of the counter flow region GB and also the interior space 21 in which the counter flow component GS also flows and in which the lower part of the NMR sample tube 22 is disposed. The additional flow channel 50 is separated from the next outermost flow channel 51 by an axial wall 53; this wall 53 has no gas passage. The gas outlet 35 through which the outer flow component MS escapes is constituted at the upper end of the additional flow channel 50; the outer flow component MS has then only once passed along the z extension of the lower portion of the NMR sample tube contained in the interior space 21.

Turbulences in the region of the fluid outlet 35 and of the gas passage 34 are avoided by the division of the total fluid flow GFS in the lower closing element 27.

Figure 6:
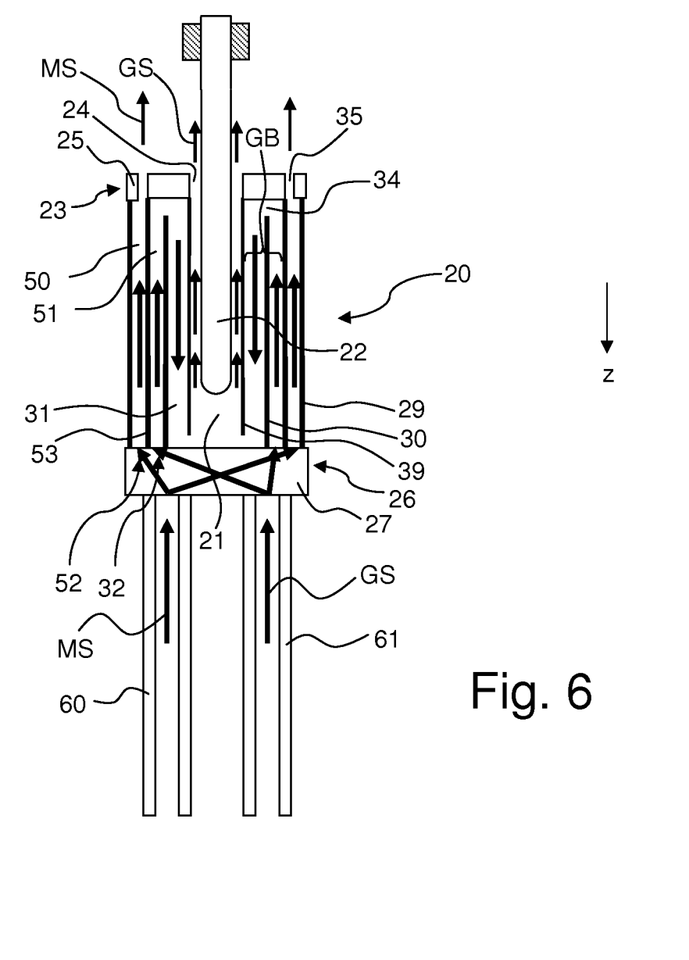
FIG. 6 A schematic axial cross-sectional view of an inventive temperature control device with separate supplies for an additional flow channel and one counter flow region.

FIG. 6 shows a further embodiment or an inventive temperature control device, which corresponds to the embodiment shown in FIG. 5 to a large extent; therefore mainly the differences as compared with the embodiment in FIG. 5 are explained.

In the embodiment shown, separate supplies 60, 61 are used for a fluid flow MS according to the outer flow principle ("outer flow") and a fluid flow GS according to the counter flow principle ("counter flow"). In particular, the outer flow and counter flow can be temperature-controlled separately and their flowrates separately regulated. Both supplies 60, 61 are here connected to the lower closing element 27.

Supply 60 feeds the additional flow channel 50 through the additional fluid inlet 52, wherein the outer flow MS flows out at fluid outlet 35 after passing along the NMR sample tube 22 once. The supply 61 feeds the outermost flow channel 51 of the counter flow region GB via the fluid inlet 32, wherein the counter flow GS, in turn, passes through all flow channels 51, 31 of the counter flow region GB and the interior space 21 along the outer surface of the sample tube 22 and then flows out through opening 24.

Note that all supplies 60, 61 and fluid inlets 32, 52 are preferably constituted at the closed end region 26 and the fluid outlet 35 is constituted at the open end region 23 to achieve a compact structure.

If gradient inversion is desired in the embodiment in FIG. 6, the axial wall 30 should be insulating to decouple the outer fluid flows flowing counter to the z direction. In that case, the counter flow GS in flow channel 31 will be thermally decoupled from the counter flow in flow channel 51, i.e. the counter flow (in flow channel 31) will be insulated from the counter flow in an upstream section (in flow channel 51). If, unlike FIG. 6, the fluid inlet 32 for the counter flow region GB were constituted at the upper axial end region 23, wall 53 should be insulating to decouple the outer flow MS flowing counter to the z direction but not the outermost portion of the counter flow GS flowing in the z direction.

In summary, this invention describes the temperature control (cooling or heating) of an NMR sample tube, wherein a slight temperature gradient is achieved by means of a fluid flow directly along the sample tube according to the counter flow principle. To support the temperature control performance, an additional fluid flow is also introduced, which provides precontrol of the temperature in the region of the counter flow and the active volume of the NMR sample tube. This additional fluid flow acts upon the region of the counter flow and the active volume of the NMR sample tube ("outer flow") from the outside. The outer flow, unlike the counter flow, is not limited by redirection and passing through a narrow gap along the outer surface of the NMR sample tube and can therefore be implemented with high flowrates—and therefore high temperature control performance.

We claim:

1. A temperature control device for an NMR sample tube, the device comprising:

multiple interleaved, concentric flow channels for temperature control fluid, said flow channels extending coaxially and surrounding a cylindrical interior space for holding the NMR sample tube, wherein said temperature control device is closed toward said interior space in a first axial end region and open to said interior space in a second axial end region opposite to said first axial end region, the NMR sample tube being inserted into said interior space at said second axial end region, wherein, in a counter flow region, adjacent flow channels are interconnected through a counter flow fluid passage at one axial end in such a way that a direction of fluid flow in flow channels of said counter flow region is reversed with respect to a corresponding adjacent flow channel in said counter flow region, an outermost flow channel of said counter flow region having a first fluid inlet at one axial end and an innermost flow channel of said counter flow region having a first fluid outlet to said interior space proximate to said closed, first axial end region, wherein at least one of said flow channels of the temperature control device has a second fluid outlet at one axial end, through which at least part of the temperature-controlling fluid flow of the temperature control device can escape from the temperature control device without passing through all flow channels of said counter flow region, wherein an axial wall that separates an outermost flow channel of said counter flow region from a next outermost flow channel, exhibits a thermal transmittance $U_{AN}$ in a transverse direction, wherein any other remaining axial walls that are located between flow channels of said counter flow region and an axial wall that separates an innermost flow channel from said interior space, each exhibit a thermal transmittance in the transverse direction greater than $U_{AN}$, greater than $3*U_{AN}$, greater than $10*U_{AN}$ or greater than $50*U_{AN}$.

2. The temperature control device of claim 1, wherein said second fluid outlet is disposed in an outermost flow channel of the temperature control device and/or in a next outermost flow channel.

3. The temperature control device of claim 1, wherein an outermost flow channel of said counter flow region and/or a next outermost flow channel of said counter flow region has said second fluid outlet at an axial end facing away from said first fluid inlet.

4. The temperature control device of claim 3, wherein all flow channels of the temperature control device are part of said counter flow region.

5. The temperature control device of claim 3, wherein said outermost flow channel of said counter flow region has an outer compartment and an inner compartment, which are separated by an axial intermediate wall, wherein said axial intermediate wall extends along a section of axial length of said outermost flow channel of said counter flow region, said section of axial length extending away from one axial end of said outermost flow channel of said counter flow region having said second fluid outlet, said outer compartment communicating with said second fluid outlet, and said inner compartment having said counter flow fluid passage to a next outermost flow channel.

6. The temperature control device of claim 1, wherein an additional flow channel surrounds an outermost flow channel of said counter flow region, wherein said additional flow channel has an additional fluid inlet at one axial end and said second fluid outlet at an opposite axial end.

7. The temperature control device of claim 6, wherein said first fluid inlet and said additional fluid inlet are constituted at a same axial end region of the temperature control device and are connected to a common supply of a temperature-controlling fluid flow.

8. The temperature control device of claim 1, wherein said second fluid outlet is constituted at one axial end of an outermost flow channel of the temperature control device and/or of a next outermost flow channel of the temperature control device that faces said second axial end region.

9. The temperature control device of claim 1, wherein said interior space is constituted as a regular cylinder and said flow channels are ring-shaped in cross-section.

10. The temperature control device of claim 1, wherein said first fluid inlet and/or said second fluid outlet and/or at least one of said counter flow fluid passages is constituted by multiple openings distributed symmetrically around a center axis of said interior space.

11. The temperature control device of claim 1, wherein said first fluid inlet and/or said second fluid outlet and/or at least one of said counter flow fluid passages is constituted by a ring-shaped gap.

12. The temperature control device of claim 1, wherein said counter flow region has exactly two interleaved flow channels.

13. The temperature control device of claim 1, wherein a number of interleaved flow channels of said counter flow region is even.

14. The temperature control device of claim 1, wherein at least one flow channel contains an RF coil or an RF coil which is seated against an inner wall of a flow channel.

15. A method for controlling a temperature of an NMR sample tube using the temperature control device of claim 1, the method comprising the steps of:
    a) conveying a temperature-controlling fluid flow according to a counter flow principle in interleaved flow channels alternately along a direction of axial extension of the NMR sample tube and in a reverse direction; and
    b) conveying a temperature-controlling fluid flow according to an outer flow principle, wherein the fluid flow according to the outer flow principle comprises at least part of a region in which the fluid flow is conveyed according to the counter flow principle and at least part of the NMR sample tube.

16. The method of claim 15, wherein the fluid flow according to the outer flow principle is conveyed only once along a direction of extension of the NMR sample tube.

17. The method of claim 15, wherein a temperature-controlling total fluid flow has a first part for temperature control according to the outer flow principle and a second part for temperature control according to the counter flow principle, wherein the first part and the second part initially flow together or initially flow together in an outermost flow channel of a temperature control device, and are separated thereafter.

18. The method of claim 17, wherein, in an upstream section, a separated second part is thermally insulated from an axial temperature gradient in a separated first part, in a jointly flowing total fluid flow or in a separated second part.

19. The method of claim 15, wherein fluid flow according to the counter flow principle and fluid flow according to the outer flow principle are conveyed completely separately or are conveyed separately and separately regulated and temperature-controlled.

20. The method of claim 19, wherein, in an upstream section, fluid flow according to the counter flow principle is thermally insulated from a temperature gradient in the fluid flow according to the outer flow principle or in the fluid flow according to the counter flow principle.

21. Use of the temperature control device of claim 1, for temperature control of an NMR sample tube, which is disposed in said interior space of the temperature control device.

22. The use of claim 21, wherein a gas, air or nitrogen is used as the fluid.

23. The use of claim 21, wherein, on an outer surface of the NMR sample tube, a temperature gradient is established in the fluid flow
    which is inverted with respect to a temperature gradient in the fluid flow in an outermost flow channel of the temperature control device.

24. A temperature control device for an NMR sample tube, the device comprising:
    multiple interleaved, concentric flow channels for temperature control fluid, said flow channels extending coaxially and surrounding a cylindrical interior space for holding the NMR sample tube, wherein said temperature control device is closed toward said interior space in a first axial end region and open to said interior space in a second axial end region opposite to said first axial end region, the NMR sample tube being inserted into said interior space at said second axial end region, wherein, in a counter flow region, adjacent flow channels are interconnected through a counter flow fluid passage at one axial end in such a way that a direction of fluid flow in flow channels of said counter flow region is reversed with respect to a corresponding adjacent flow channel in said counter flow region, an outermost flow channel of said counter flow region having a first fluid inlet at one axial end and an innermost flow channel of said counter flow region having a first fluid outlet to said interior space proximate to said closed, first axial end region, wherein at least one of said flow channels of the temperature control device has a second fluid outlet at one axial end, through which at least part of the temperature-controlling fluid flow of the temperature control device can escape from the temperature control device without passing through all flow channels of said counter flow region, wherein an outermost flow channel of said counter flow region and/or a next outermost flow channel of said counter flow region has said second fluid outlet at an axial end facing away from said first fluid inlet, wherein said outermost flow channel of said counter flow region has an outer compartment and an inner compartment, which are separated by an axial intermediate wall, wherein said axial intermediate wall extends along a section of axial length of said outermost flow channel of said counter flow region, said section of axial length extending away from one axial end of said outermost flow channel of said counter flow region having said second fluid outlet, said outer compartment communicating with said second fluid outlet, and said inner compartment having said counter flow fluid passage to a next outermost flow channel.

* * * * *